United States Patent
Min et al.

(10) Patent No.: US 9,142,602 B2
(45) Date of Patent: Sep. 22, 2015

(54) DISPLAY DEVICE HAVING ANISOTROPIC CONDUCTIVE FILM AND MANUFACTURING METHOD THEREOF

(71) Applicant: Samsung Display Co., Ltd., Yongin, Gyeonggi-do (KR)

(72) Inventors: Jin Sic Min, Yongin (KR); Dae Geun Lee, Yongin (KR); Sang Urn Lim, Yongin (KR); Eu Tteum Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/265,737

(22) Filed: Apr. 30, 2014

(65) Prior Publication Data

US 2015/0108436 A1   Apr. 23, 2015

(30) Foreign Application Priority Data

Oct. 17, 2013   (KR) .......................... 10-2013-0124228

(51) Int. Cl.
*H01L 27/32* (2006.01)
*H01L 51/52* (2006.01)
*H01L 51/56* (2006.01)

(52) U.S. Cl.
CPC .......... *H01L 27/3276* (2013.01); *H01L 51/524* (2013.01); *H01L 51/529* (2013.01); *H01L 51/56* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 2007/0247807 A1* | 10/2007 | Kondo et al. | 361/688 |
| 2011/0079799 A1* | 4/2011 | Lee et al. | 257/91 |
| 2013/0236767 A1* | 9/2013 | Nishikawa et al. | 429/145 |

FOREIGN PATENT DOCUMENTS

| | | |
|---|---|---|
| KR | 10-2007-0032463 | 3/2007 |
| KR | 10-2008-0020841 | 3/2008 |
| KR | 10-2011-0024552 | 3/2011 |

* cited by examiner

*Primary Examiner* — William F Kraig
*Assistant Examiner* — Khaja Ahmad
(74) *Attorney, Agent, or Firm* — Knobbe Martens Olson & Bear LLP

(57) ABSTRACT

A display device includes a substrate including a wiring portion, a pad unit provided on the substrate and extended from the wiring portion, an integrated circuit chip electrically connected to the pad unit and mounted on the substrate, and an anisotropic conductive film configured to electrically connect the pad unit and the integrated chip to each other. The anisotropic conductive film includes an adhesive layer provided between the pad unit and the integrated circuit chip and at least one conductive ball scattered in the adhesive layer. A heat generator is also provided on the substrate. The heat generator is configured to come into contact with the anisotropic conductive film to supply heat to the anisotropic conductive film.

8 Claims, 8 Drawing Sheets

DISPLAY DEVICE HAVING ANISOTROPIC CONDUCTIVE FILM AND MANUFACTURING METHOD THEREOF

CROSS-REFERENCE TO RELATED APPLICATIONS

This application claims priority to, and the benefit of, Korean Patent Application No. 10-2013-0124228 filed in the Korean Intellectual Property Office on Oct. 17, 2013, the entire contents of which are incorporated herein by reference.

BACKGROUND

1. Field

The present disclosure relates to a display device in which an integrated circuit chip is mounted on a substrate by using an anisotropic conductive film.

2. Description of the Related Technology

A display device, such as for example an OLED display device, can be manufactured by forming elements on a substrate made of glass or plastic, and integrated circuit (IC) chips for generating various signals to operate the display device may be mounted on a certain region of the substrate forming the display device. The IC chips may be divided into a chip on glass (COG) or a chip on flexible printed circuit board (COF) type, according to the mounting position of the chips.

In the case of the COG in which the IC chip is mounted on the substrate, an anisotropic conductive film (ACF) is interposed between a pad formed in the substrate and the terminal of the IC chip, to mount the IC chip on the substrate.

Heat is typically applied to the ACF for softening/hardening thereof in order to electrically connect the IC chip and the electrode pad with each other through the ACF. In this case, it is necessary to prevent the IC chip from being unnecessarily affected by the heat applied to the ACF.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

The described technology has been made in an effort to provide a display device having advantages of mounting an integrated circuit chip on a substrate.

The described technology has also been made in an effort to provide a manufacturing method of a display device having advantages of manufacturing the display device.

One embodiment provides a display device including: a substrate including a wiring portion; a pad unit provided on the substrate and extended from the wiring portion; an integrated circuit chip electrically connected to the pad unit and mounted on the substrate; an anisotropic conductive film configured to electrically connect the pad unit and the integrated circuit chip to each other and including an adhesive layer provided between the pad unit and the integrated circuit chip and at least one conductive ball scattered in the adhesive layer; and a heat generator provided on the substrate configured to come into contact with the anisotropic conductive film to supply heat to the anisotropic conductive film.

The pad unit may include a plurality of pads disposed on the substrate to form a pad region, and the heat generator may be located along a circumference of the pad regions.

The pad region may include a plurality of pad regions, and the heat generator may be disposed in a plurality of rows between the pad regions.

The heat generator may include a conductive line.

The conductive line may include at least one of a current or a power application point, and the at least one of a current or power application point may be located outside the anisotropic conductive film.

The conductive line may contain nichrome.

The wiring portion may include a source electrode and a drain electrode, and the pad unit may be formed of the same material as that of the source electrode and the drain electrode.

The display device may include: a first electrode electrically connected to the drain electrode; an organic emission layer provided on the first electrode; and a second electrode provided on the organic emission layer.

The display device may further include an encapsulation body coupled to and covering a portion of the substrate, and the pad unit may be disposed at a portion of the substrate which is not covered with the encapsulation body.

Another embodiment provides a manufacturing method of a display device including: providing a pad unit on a substrate, wherein the pad unit is extended from a wiring portion; overlapping an anisotropic conductive film with the pad unit while bringing the anisotropic conductive film into contact with a heat generator provided on the substrate; disposing an integrated circuit chip on the anisotropic conductive film; transferring heat generated from the heat generator to the anisotropic conductive film by applying at least one of a current or a power to the heat generator; electrically connecting the integrated circuit chip and the pad unit by pressing the integrated circuit chip; and cooling the heat generator and the anisotropic conductive film by cutting off the at least one of the current or the power applied from the heat generator.

DETAILED DESCRIPTION OF CERTAIN INVENTIVE EMBODIMENTS

Figure 1:
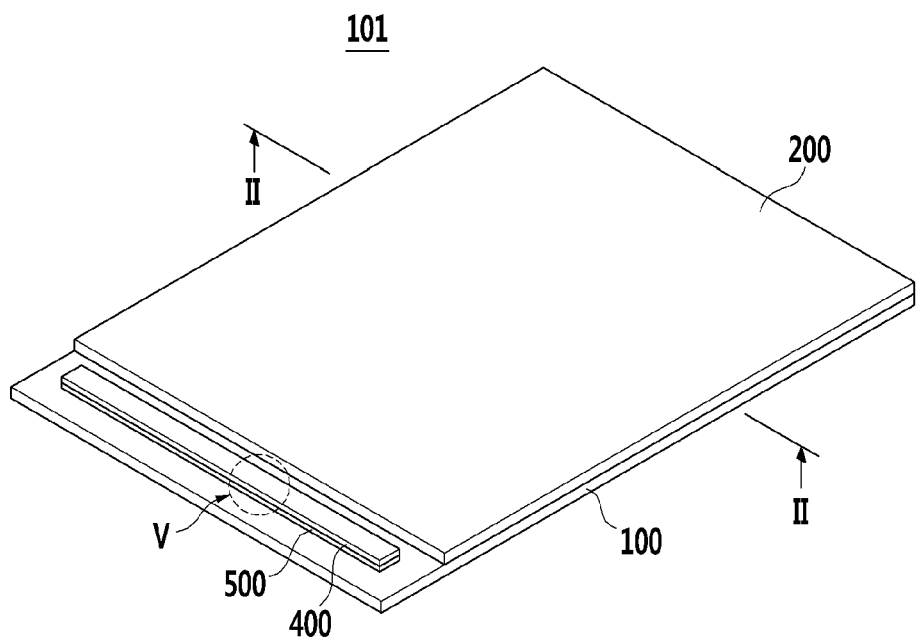
FIG. 1 is a perspective view showing a display device in accordance with one embodiment.

In the following detailed description, certain embodiments have been shown and described, simply by way of illustration.

As those skilled in the art would realize, the described embodiments may be modified in various ways, without departing from the spirit or scope of the present invention.

In the drawings and this specification, parts or elements that are not related to the description hereof are omitted in order to clearly describe the embodiments, and the same or like constituent elements are generally designated by the same reference numerals throughout the specification.

In addition, the size and thickness of each component shown in the drawings are arbitrarily shown for better understanding and ease of description, but the present invention is not limited thereto.

In the drawings, the thickness of layers, films, panels, regions, etc., may be exaggerated for clarity and better understanding. When a first part of a layer, a film, a plate, or the like is described as being arranged "on" or "over" a second part, this indicates that the first part is arranged on or over the second part directly or with a third part therebetween without the limitation to the upper side thereof on the basis of the gravity direction.

In addition, as the display device, an organic light emitting diode (OLED) display including an organic emission layer will be described as an example, but embodiments are not limited thereto, and the display device may be a liquid crystal display (LCD), a plasma display panel (PDP), or a field emission display.

Further, although an active matrix type of OLED display of a 2Tr-1Cap structure in which one pixel has two thin film transistors and one capacitor is illustrated in the accompanying drawings, embodiments are not limited thereto. Accordingly, the organic light emitting diode (OLED) display is not limited by the number of thin film transistors, capacitors, and wires. Herein, the pixel is a minimum unit that can display an image, and the OLED display displays an image using a plurality of pixels.

Hereinafter, a display device in accordance with one embodiment will be described with reference to FIG. 1 to FIG. 10. FIG. 1 is a perspective view showing a display device in accordance with one embodiment.

As shown in FIG. 1, the display device 101 includes a substrate 100, an encapsulation body 200, a pad unit 300 (see FIG. 6), an integrated circuit (IC) chip 400, and an anisotropic conductive film (ACF) 500.

The encapsulation body 200 has a smaller size than that of the substrate 100 in order to cover the substrate 100. Accordingly, a portion of the substrate 100 is not covered with the encapsulation body 200, and the IC chip 400 is disposed at the non-covered portion of the substrate 100 next to the encapsulation body 200 and is mounted in the substrate 100 by the ACF 500.

Figure 2:
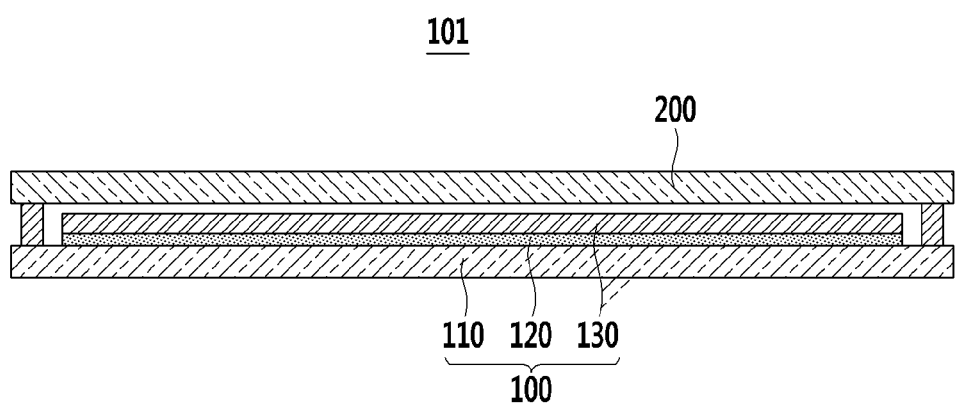
FIG. 2 is a cross-sectional view of the display device taken along line II-II of FIG. 1.

FIG. 2 is a cross-sectional view of the display device taken along line II-II of FIG. 1. As shown in FIG. 2, the substrate 100 includes a main body 110, a wiring portion 120, and an organic light emitting diode (OLED) 130.

The main body 110 is formed of an insulator made of, for example, glass, quartz, ceramic, plastic, or the like. In some embodiments, the main body 110 may be formed of metal, such as for example stainless steel.

The wiring portion 120 and the OLED 130 formed on the main body 110 are located between the main body 110 and the encapsulation body 200.

The wiring portion 120 includes first and second thin film transistors 10 and 20 (see FIG. 3) to drive the OLED 130. The OLED 130 serves to emit light according to a driving signal transmitted from the wiring portion 120.

Figure 3:
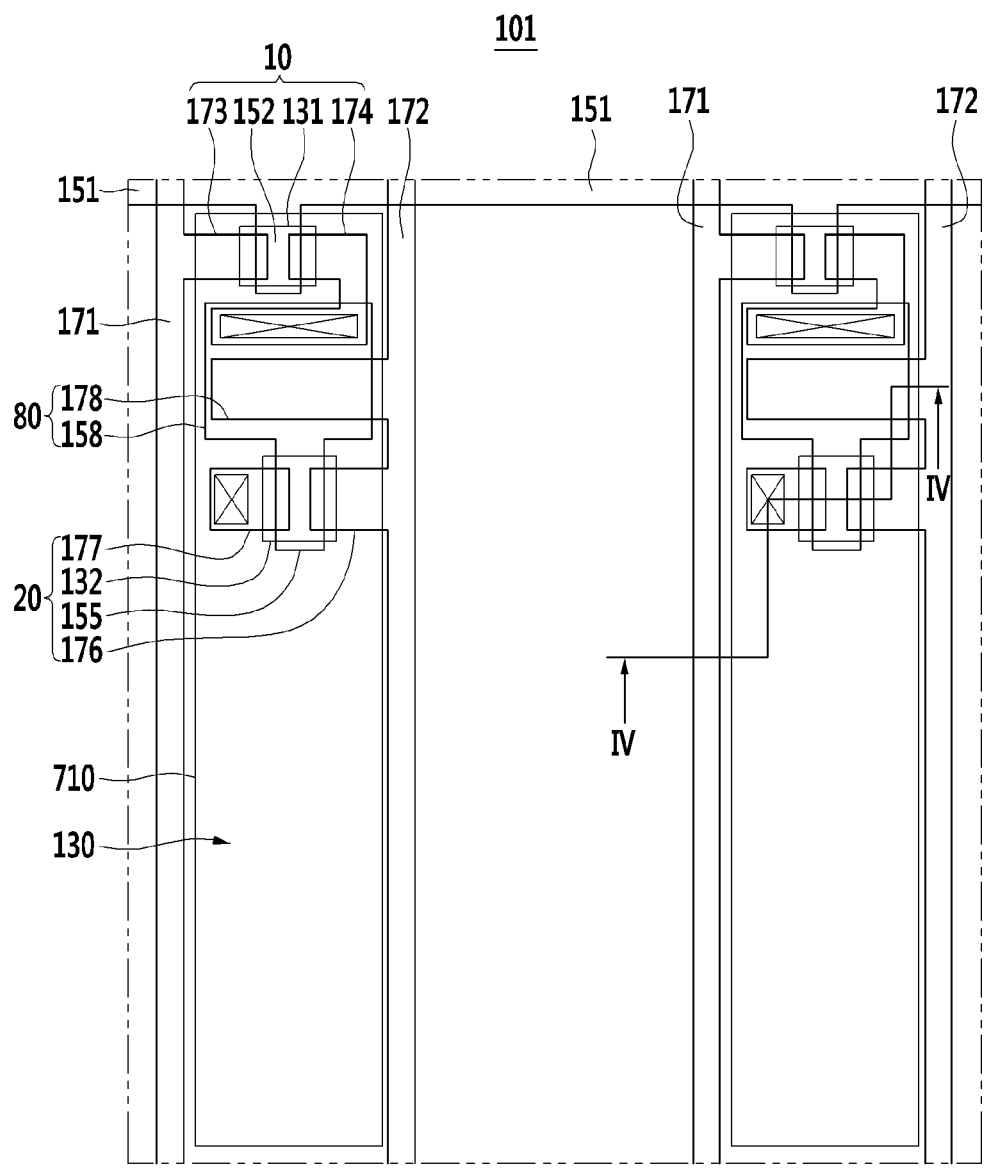
FIG. 3 is a layout view showing a pixel structure of the display device in accordance with one embodiment.
Figure 4:
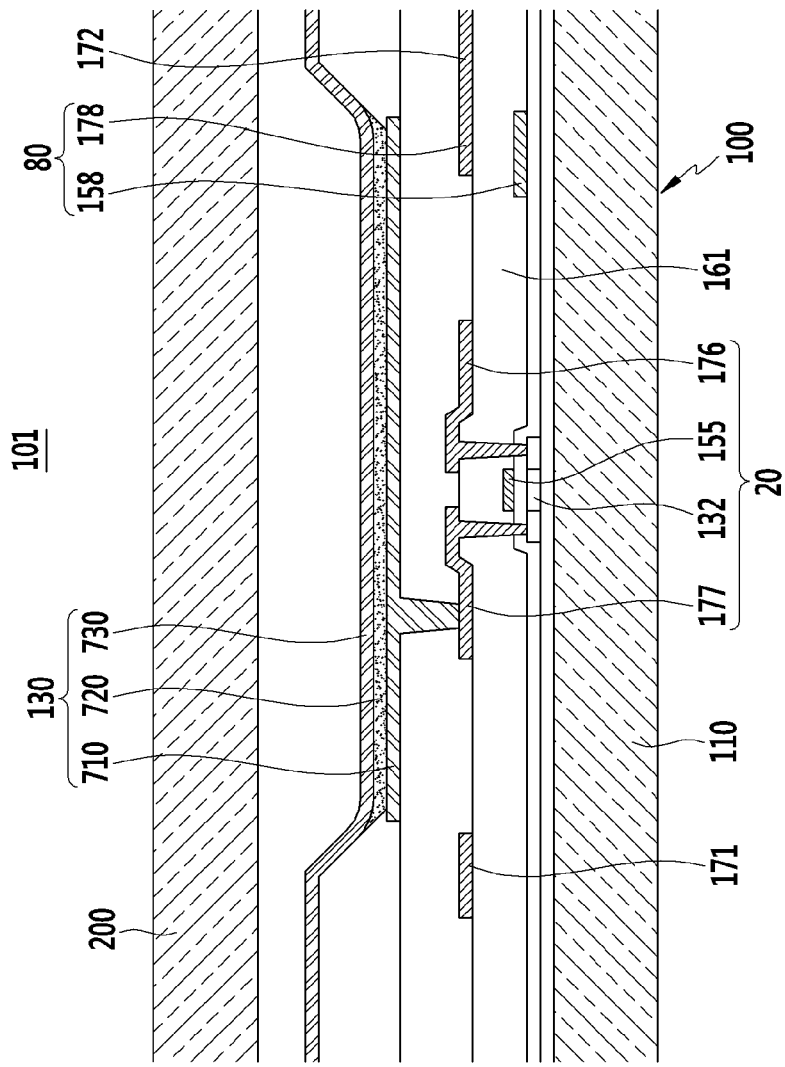
FIG. 4 is a cross-sectional view of the display device taken along line IV-IV of FIG. 3.

Detailed structures of the organic light emitting element 130 and the wiring portion 120 are shown in FIG. 3 and FIG. 4, but embodiments are not limited to the structures shown in FIG. 3 and FIG. 4. The OLED 130 and the wiring portion 120 may be formed with various configurations within a range that can be easily modified or realized by a person skilled in the art.

Hereinafter, an internal structure of the display device 101 will be described in detail with reference to FIG. 3 and FIG. 4.

FIG. 3 is a layout view showing a pixel structure of the display device in accordance with one embodiment. FIG. 4 is a cross-sectional view of the display device taken along line IV-IV of FIG. 3.

As shown in FIG. 3 and FIG. 4, the display device 101 includes a switching thin film transistor 10, a driving thin film transistor 20, a capacitor 80, and the OLED 130, for each pixel. The switching thin film transistor 10, the driving thin film transistor 20, and the capacitor 80 form the wiring portion 120. The wiring portion 120 further includes a gate line 151 disposed in one direction of the flexible substrate 100, a data line 171 crossing the gate line 151 in an insulated manner, and a common power supply line 172. One pixel is defined as a boundary of the gate line 151, the data line 171, and the common power supply line 172, but is not limited thereto.

The OLED 130 includes a first electrode 710, an organic emission layer 720 formed on the first electrode 710, and a second electrode 730 formed on the organic emission layer 720. The first electrode 710 may be a positive electrode (+) as a hole injection electrode, and the second electrode 730 may be a negative electrode (−) as an electron injection electrode. Embodiments are not limited thereto, and the first electrode 710 may be a cathode and the second electrode 730 may be an anode according to the driving method of the display device 101. Holes and electrons from the first electrode 710 and the second electrode 730 are respectively injected inside the organic emission layer 720, and when excitons being combinations of the injected holes and electrons shift from an excited state to a ground state, light is emitted from the organic emission layer 720.

Further, in the display device 101, the OLED 130 emits light in the direction of the encapsulation body 200. In such embodiments, the organic light emitting element 130 is a front emission type. The pixel electrode 710 is made of a reflective conducting material, and the common electrode 730 is made of a transmissive conducting material.

The capacitor 80 includes a pair of capacitor electrode plates 158 and 178, and an interlayer insulating layer 161 interposed between the two capacitor electrode plates 158 and 178. The interlayer insulating layer 161 functions as a dielectric, and the capacitance is determined depending upon electrical charges charged at the capacitor 80 and the voltages applied to the two capacitor electrode plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting pixels to emit light. The switching gate electrode 152 is connected to the gate line 151. The switching source electrode 173 is connected to the data line 171. The switching drain electrode 174 is disposed separately from the switching source electrode 173, and is connected to the capacitor electrode plate 158.

The driving thin film transistor 20 applies a driving voltage to the pixel electrode 710 to excite the organic emissive layer 720 of the OLED 130 in the selected pixel. The driving gate electrode 155 is connected to the capacitor electrode plate 158 that is connected to the switching drain electrode 174. The driving source electrode 176 and the other capacitor electrode plate 178 are each connected to the common power line 172. The driving drain electrode 177 is connected to the first electrode 710 of the OLED 130 through a contact hole.

The switching source electrode 173, the switching drain electrode 174, the driving source electrode 176, and the driving drain electrode 177 are formed with the same layer, and are made of the same material as that of the pad unit 300 described below. The switching source electrode 173, the switching drain electrode 174, the driving source electrode 176, and the driving drain electrode 177 are formed with the same process as that of the pad unit 300, thereby being connected to each other.

With the above structure, the switching thin film transistor 10 is operated by the gate voltage applied to the gate line 151, and transmits a data voltage applied to the data line 171 to the driving thin film transistor 20. A voltage corresponding to a difference between the common voltage applied to the driving thin film transistor 20 from the common power line 172, and the data voltage transmitted from the switching thin film transistor 10 is stored at the capacitor 80, and a current corresponding to the voltage stored at the capacitor 80 flows to the OLED 130 through the driving thin film transistor 20 to thereby excite the OLED 130.

Figure 5:
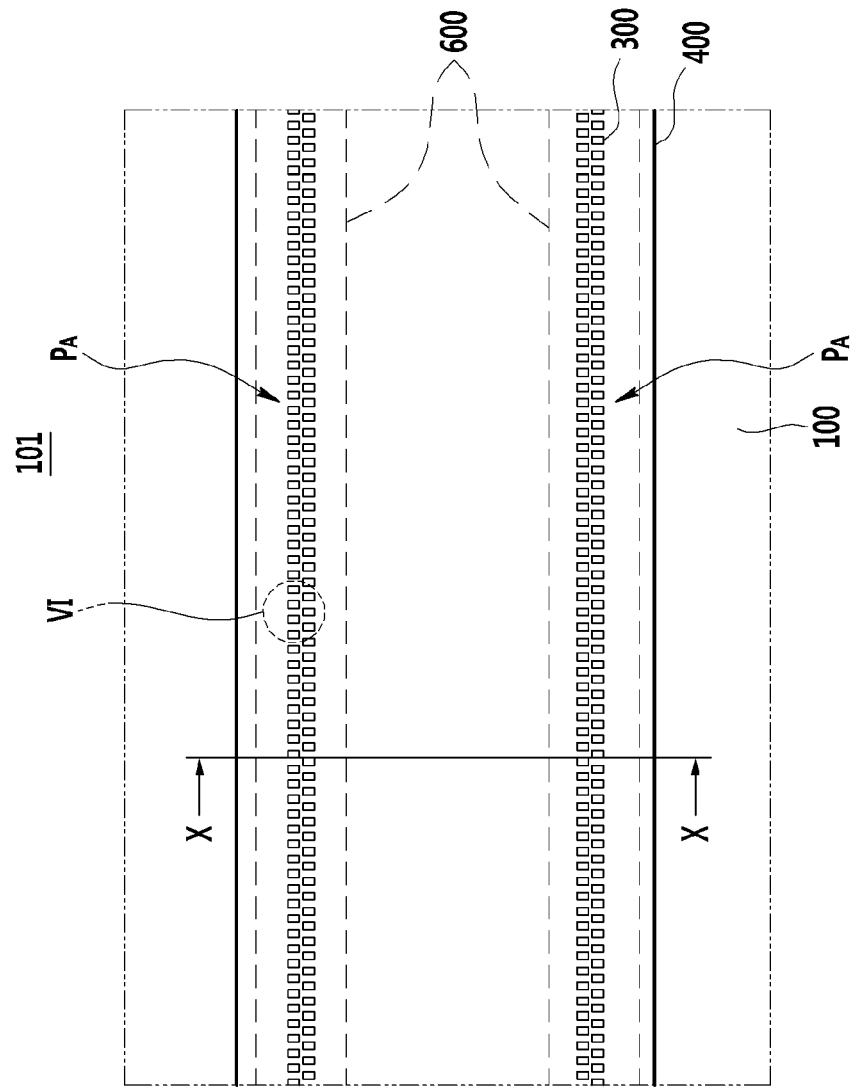
FIG. 5 is an enlarged plan view of portion V of FIG. 1.
Figure 6:
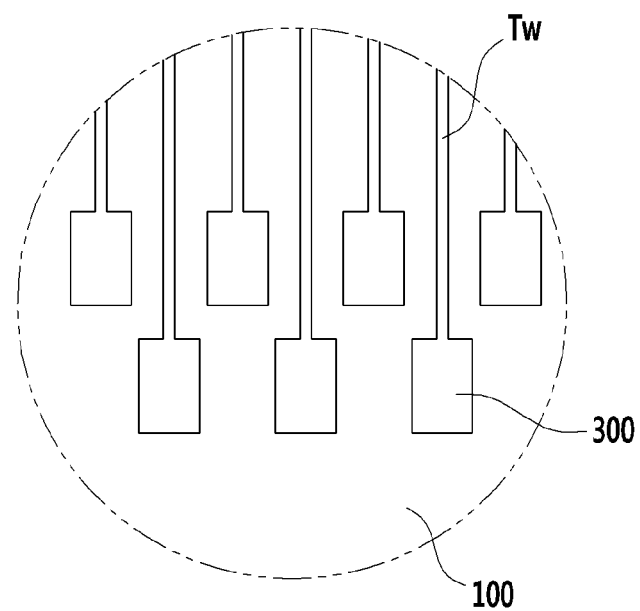
FIG. 6 is an enlarged plan view of portion VI of FIG. 5.

FIG. 5 is an enlarged plan view of portion V of FIG. 1. FIG. 6 is an enlarged plan view of portion VI of FIG. 5.

As shown in FIG. 5 and FIG. 6, the pad unit 300 is connected to the thin film wire TW extended from the wiring portion 120. Specifically, the thin film wire TW connects between the switching source electrode 173, the switching drain electrode 174, the driving source electrode 176, and the driving drain electrode 177. The thin film wire TW may be formed of the same material as that of the electrodes 173, 174, 176 and 177.

The pad unit 300 is disposed to correspond to the IC chip 400, and is connected to the IC chip 400 by the ACF 500. The pad unit 300 may include a plurality of pads formed on the substrate 100 to form a plurality of pad regions $P_A$. When the IC chip 400 is provided on the substrate 100 to be connected to the pad unit 300, the pad unit 300 is located at such a position so as to be covered by the IC chip 400.

A heat generator 600 may be formed on the substrate 100 around the pad regions $P_A$ to heat the ACF 500. The heat generator 600 is described in more detail with reference to FIG. 7.

Figure 7:
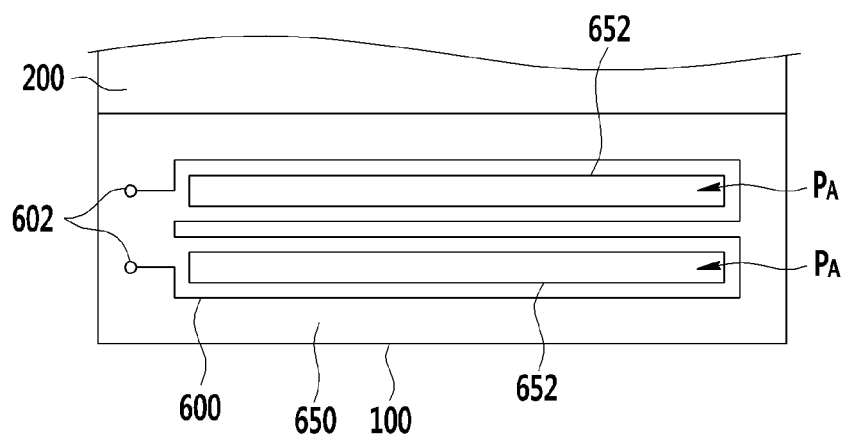
FIG. 7 is a partial plan view showing a structure in which a heat generator is disposed on a substrate in accordance with one embodiment.

Referring to FIG. 7, the heat generator 600 is disposed along a circumference of the pad regions $P_A$. In one embodiment, the heat generator 600 may be formed of a conductive line made of a material such as, for example, nichrome. The conductive line may be wired on the substrate 100 along the circumference of the pad regions $P_A$ while locating application points 602 for current or power application at one side of the substrate 100. In this case, the conductive line may be formed on an insulation film 650 provided on the substrate 100 to prevent the pad unit 300 from being electrically short-circuited. The pad unit 300 and the thin film wire Tw are disposed below the insulation film 650, and an opening 652 through which the pad unit 300 is exposed may be formed in the insulation film 650 to substantially electrically connect the pad unit 300 to the IC chip 400.

Figure 8:
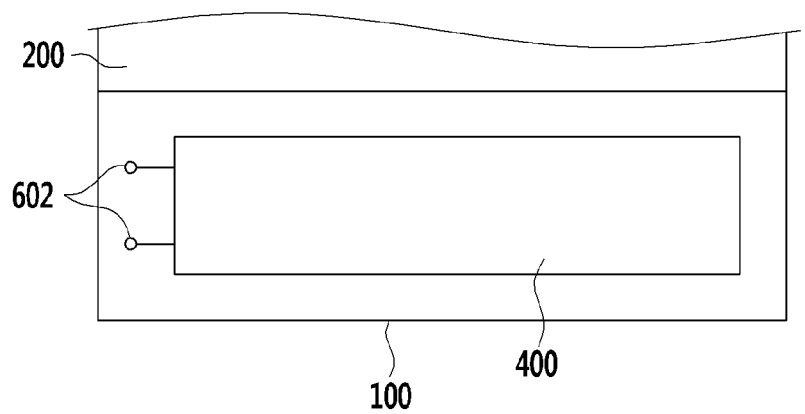
FIG. 8 is a partial plan view showing a state in which the heat generator is covered by an IC chip in accordance with one embodiment.

FIG. 7 shows the heat generator 600 and the pad regions $P_A$ over which the IC chip 400 is not located, while FIG. 8 shows the heat generator 600 and the pad regions $P_A$ over which the IC chip 400 is located.

As shown in FIG. 8, the power or current application points 602 of the conductive line serving as the heat generator 600 are not covered with the IC chip 400 in a state where the IC chip 400 is disposed on the substrate 100 in such a way so as to cover the pad regions $P_A$ or the plurality of pads (pad units) 300 with the IC chip 400.

In one embodiment, the ACF 500 may be disposed between the pad regions $P_A$ and the IC chip 400 to electrically connect the pad unit 300 and the IC chip 400 to each other through the following process.

Figure 9:
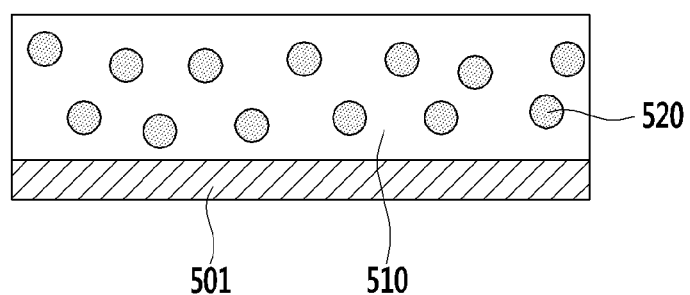
FIG. 9 is a cross-sectional view showing an ACF in accordance with one embodiment.

First, the ACF 500, as shown in FIG. 9, includes a film 501, an adhesive layer 510, and conductive balls 520.

The film 501 is attached to a first surface of the adhesive layer 510, and may be formed of a material having flexibility. The film 501 can be separated from the adhesive layer 510 when IC chips are mounted on the substrate 100. An IC chip is attached to a second surface of the adhesive layer 510 which is exposed to the outside without being attached to the film 501, and the film 501 is detached from the first surface of the adhesive layer 510. Thereafter, the first surface of the adhesive layer 510 which is exposed by the detachment of the film 501 is attached to the substrate 100 to mount the IC chip 400 on the substrate 100.

The adhesive layer 510 is formed of a resin. In the case that the IC chip 400 is mounted on the substrate 100, the substrate 100 and the IC chip 400 are respectively formed at opposite surfaces of the adhesive layer 510. The adhesive layer 510 is melted or stiffened depending on a treatment performed. For example, the adhesive layer 510 may be melted by heat, or stiffened in a natural condition. For the adhesive layer 510, melting and stiffening characteristics can be controlled by varying the treatment to be performed. Accordingly, the IC chip 400 can be mounted on the substrate 100 by controlling the melting and stiffening characteristics of the adhesive layer 510.

The heat generator 600 is provided to heat the adhesive layer 510 of the ACF 500. Specifically, once a current or a power is applied to the heat generator 600 through the application points 602, heat is generated and is transferred to the adhesive layer 510 to thereby facilitate the mounting of the IC chip 400 on the substrate 100 through the above-mentioned steps.

To that end, the adhesive layer 510 of the ACF 500 comes into contact with the heat generator 600 when the ACF 500 is disposed on the substrate 100 along with the IC chip 400.

Figure 10:
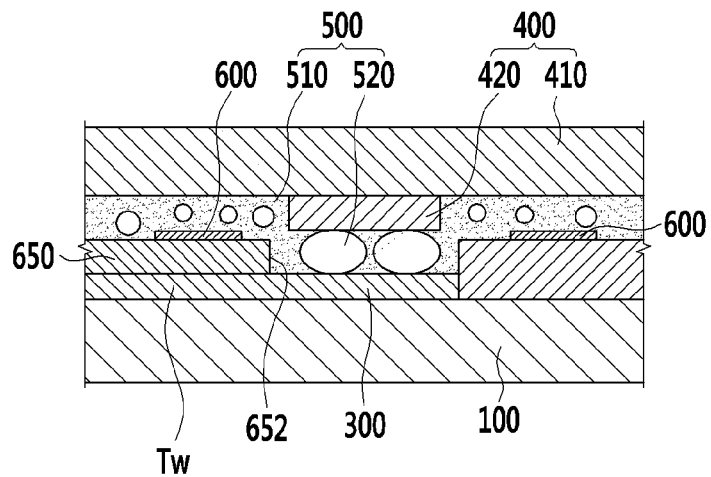
FIG. 10 is a cross-sectional view showing the display device taken along line X-X of FIG. 5.

As such, when the heat generated from the heat generator 600 is transferred to the adhesive layer 510, the IC chip 400 is pressed from the outside by a pressing head (not shown). Accordingly, as shown in FIG. 10, the conductive balls 520 of the ACF 500 are brought into contact with the pad unit 300 to electrically connect a bump 420 located at a lower end of a main body 410 of the IC chip 400 to the pad unit 300.

When the current or the power applied to the heat generator 600 is cut off, the heat generator 600 and the adhesive layer 510 of the ACF 500 heated thereby are cooled to a natural condition. Accordingly, the adhesive layer 510 is stiffened so as to securely connect the IC chip 400 to the pad unit 300.

As such, when the IC chip 400 and the pad unit 300 are connected to each other, only the pressurization is provided to the IC chip 400. The heat transferred to the ACF 500 for the electrical connection therebetween is provided through the heat generator 600 disposed on the substrate 100. Accordingly, unnecessary heat can be prevented from being applied to the IC chip 400, so it is possible to prevent thermal expansion of the IC chip 400. Further, the bump 420 of the IC chip 400 can be adequately connected to the pad unit 300 without misalignment therebetween.

Figure 11:
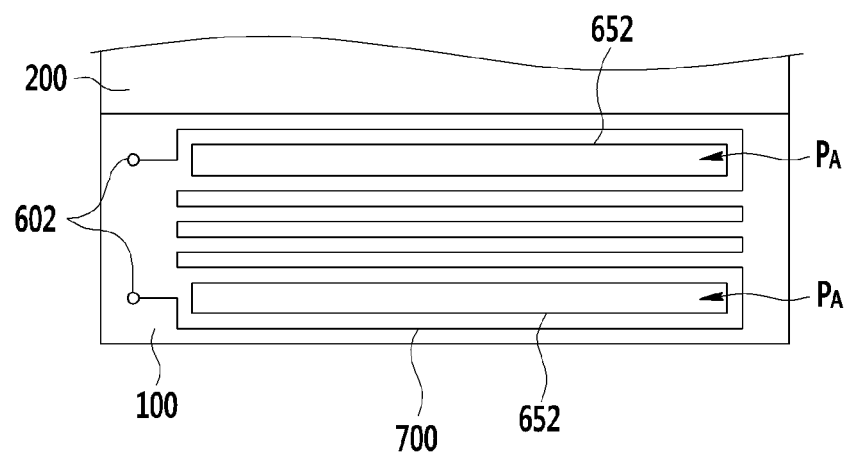
FIG. 11 is a plan view showing a structure in which a heat generator is disposed on a substrate in accordance with another embodiment.

FIG. 11 shows a layout of a heat generator in accordance with another embodiment. The heat generator 700 is disposed along the circumference of the pad regions $P_A$ of the pad unit in a plurality rows between the pad regions $P_A$ as in the aforementioned embodiment. The rows may be formed to have a serpentine shape. As such, the heat generator 700 is more densely disposed around the pad regions $P_A$. Accordingly, when the pad unit and the IC chip are connected to each other, heat can be uniformly transferred to an entire area of the ACF, thereby improving the connection between the pad unit and the IC chip.

In accordance with embodiments of the present invention, when the IC chip is connected to the pad unit formed on the substrate, it is possible to transfer the heat to be applied to the ACF interposed therebetween through the heat generator provided on the substrate instead of using the IC chip.

Accordingly, unnecessary heat can be kept from the IC chip during the manufacturing process for connecting the pad unit and the IC chip.

Therefore, it is possible to accomplish the connection between the pad unit and the IC chip without causing an external disturbance (such as, for example, thermal expansion of the IC chip), which is advantageous in the manufacture of display devices.

While this invention has been described in connection with certain embodiments, it is to be understood that the invention is not limited to the disclosed embodiments, and is intended to cover various modifications and equivalent arrangements included within the spirit and scope of the appended claims.

What is claimed is:

1. A display device comprising:
   a substrate including a wiring portion;
   a pad unit provided on the substrate and extended from the wiring portion;
   an integrated circuit chip electrically connected to the pad unit and mounted on the substrate;
   an insulating film provided on the substrate;
   an anisotropic conductive film configured to electrically connect the pad unit and the integrated circuit chip to each other and including an adhesive layer provided between the pad unit and the integrated circuit chip and at least one conductive ball scattered in the adhesive layer; and
   a heat generator provided on the substrate configured to come into contact with the anisotropic conductive film to supply heat to the anisotropic conductive film, wherein the heat generator is interposed between the insulating film and anisotropic conductive film, and the insulating film is interposed between the heat generator and the wiring portion, and
   wherein the heat generator includes a conductive line including at least one of a current application point or a power application point and wherein the at least one of a current application point or a power application point is not covered by the integrated circuit chip.

2. The display device of claim 1, wherein the pad unit includes a plurality of pads disposed on the substrate to form a pad region, and wherein the heat generator is located along a circumference of the pad region.

3. The display device of claim 2, wherein the pad region includes a plurality of pad regions, and wherein the heat generator is disposed in a plurality of rows between the plurality of pad regions.

4. The display device of claim 1, wherein the at least one of the current application point or the power application point is located outside the anisotropic conductive film.

5. The display device of claim 1, wherein the conductive line contains nichrome.

6. The display device of claim 1, wherein
   the wiring portion includes a source electrode and a drain electrode, and
   the pad unit is formed of the same material as that of the source electrode and the drain electrode.

7. The display device of claim 6, wherein the display device includes:
   a first electrode electrically connected to the drain electrode;
   an organic emission layer provided on the first electrode; and
   a second electrode provided on the organic emission layer.

8. The display device of claim 7, wherein
   the display device further includes an encapsulation body coupled to and covering a portion of the substrate, and
   the pad unit is disposed at a portion of the substrate which is not covered with the encapsulation body.

* * * * *